(12) United States Patent
Ijitsu

(10) Patent No.: US 8,687,433 B2
(45) Date of Patent: Apr. 1, 2014

(54) MEMORY CONTROL CIRCUIT AND MEMORY CIRCUIT

(71) Applicant: Fujitsu Limited, Kawasaki (JP)

(72) Inventor: Kenji Ijitsu, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/759,126

(22) Filed: Feb. 5, 2013

(65) Prior Publication Data

US 2013/0148442 A1 Jun. 13, 2013

Related U.S. Application Data

(63) Continuation of application No. PCT/JP2010/063742, filed on Aug. 13, 2010.

(51) Int. Cl.
*G11C 7/00* (2006.01)

(52) U.S. Cl.
USPC .............................. 365/189.011; 365/185.24

(58) Field of Classification Search
USPC ...................................... 365/189.011, 185.24
See application file for complete search history.

(56) References Cited

U.S. PATENT DOCUMENTS

| | | | |
|---|---|---|---|
| 7,301,793 B2 | 11/2007 | Kanehara et al. | |
| 7,366,037 B2 | 4/2008 | Sumitani et al. | |
| 7,924,605 B2 | 4/2011 | Fujimoto | |
| 7,990,760 B2 | 8/2011 | Fukano | |
| 8,107,278 B2 | 1/2012 | Sasaki et al. | |
| 8,450,713 B2 * | 5/2013 | Awaya et al. | 257/3 |
| 2006/0101301 A1 * | 5/2006 | Nagao et al. | 713/600 |
| 2010/0219392 A1 * | 9/2010 | Awaya et al. | 257/3 |

FOREIGN PATENT DOCUMENTS

| | | |
|---|---|---|
| JP | 10-149680 | 6/1998 |
| JP | 2005-025859 | 1/2005 |
| JP | 2006-344303 | 12/2006 |
| JP | 2007-273007 | 10/2007 |
| JP | 2009-16809 A | 1/2009 |
| JP | 2009-116994 | 5/2009 |
| JP | 2009-140558 | 6/2009 |

OTHER PUBLICATIONS

International Search Report, mailed in connection with PCT/JP2010/063742 and mailed Nov. 16, 2010.
Japanese Office Action mailed Sep. 17, 2013 for corresponding Japanese Application No. 2012-528555, with Partial English-language Translation.

* cited by examiner

*Primary Examiner* — Michael Tran
(74) *Attorney, Agent, or Firm* — Fujitsu Patent Center

(57) ABSTRACT

A memory circuit includes a plurality of divided memory cell blocks, a write circuit and a read circuit which connect via a pair of bit lines to each of the divided memory cell blocks. The output of write data to one of the bit line of the write circuit is made to be performed by one system. It is possible to achieve an increase of speed by bit lien division while reducing increase in the memory circuit area accompanying the bit line division.

13 Claims, 12 Drawing Sheets

MEMORY CONTROL CIRCUIT AND MEMORY CIRCUIT

CROSS-REFERENCE TO RELATED APPLICATION

This application is a continuation application of International Application PCT/JP2010/063742 filed on Aug. 13, 2010 and designated the U.S., the entire contents of which are incorporated herein by reference.

FIELD

The embodiments discussed herein are related to a memory control circuit and a memory circuit.

BACKGROUND

For faster operation speed of the memory, a configuration to divide a memory cell array is known. For example, a SRAM (Static Random Access Memory) which is one type of RAM is adopted as a structure to divide a memory cell array.

FIG. 12 is a block diagram of a conventional memory circuit. As depicted by FIG. 12, memory cells 102-0~102-n of the memory circuit is divided into two memory cell blocks 100A and 100B. The first memory cell block 100A includes a memory cell 102-0~102-m. The second memory cell block 100B includes a memory cell 102-m+1~102-n.

The memory control circuit 110 is provided between the memory cell blocks 100A and 100B. The memory control circuit 110 is provided one pair of write circuits 112 and 114 and a single read circuit 116. The write circuit 112 connects to the memory cell block 100A by a bit line blx_a and a bit line bl_a. In addition, the single read circuit 116 connects to two the memory cell blocks 100A. The read circuit 116 connects to the memory cell blocks 100A and 100B by the bit line bl_a and a bit line bl_b. Word selection signals WL0~WLn select the memory cell 102-0~102-n.

The read circuit 116 uses a single-ended input circuit or a differential sense amplifier to read data from the memory cell 102-0~102-n. In FIG. 12, the read circuit 116 illustrates the single-ended input circuit. In this case, in order to prevent a malfunction, it is necessary to design an equivalent load of a pair of bit lines blx_a and bl_a and bit lines blx_b and bl_b, which are connected to the memory cell 102-0~102-n, as much as possible. Therefore, as depicted by FIG. 12, wiring lengths of pairs of bit lines that are connected to the memory cell 102-0~102-n and the number of connected memory cells, has been designed to be symmetrical to.

Further, as depicted by the conventional example in FIG. 12, in order to speed up, the pair of the bit lines (blx_a and bl_a, and blx_b and bl_b) is divided between the memory cell array so as to be equivalent.

RELATED ART

Japanese Laid-open Patent Publication No. Hei 10-149680

It is desired that the memory is increased capacity and makes a high speed. In particular, in a LSI (large Scaled Integrated) circuit which mixes the other function circuit, for example, an arithmetic processing unit (CPU: Central Processing Unit), and the memory, it is adopted to increase the amount of memory installed in the LSI or to increase an operating frequency of the LSI.

Therefore, it is desired that the memory that is mounted to the LSI has smaller area and increases the operating speed.

However, to achieve both faster and smaller area of the memory, there is a need to address the following problems.

In order to reduce the area of the memory circuit, it is necessary to reduce a size of transistors which are components of a memory circuit, or to reduce components which constructs of the memory circuit. However, when the size of the transistor (hereinafter referred to as "Tr") is reduced, the operating speed of the memory becomes slow because the transistor performance is worse. Further, when the components which constructs the memory circuit is reduced, the memory circuit does not performs necessary operation because necessary functions can not be provided to the memory circuit.

In order to speed up the operation of the memory circuit, it is necessary to increase the size of Tr which is a component constituting the memory circuit, or divide the bit line to a short line in order to reduce the load of the bit lines which are connected to the memory cell. However, when increasing the size of the Tr, the area of the memory circuit becomes large. When speed up by dividing the bit line short, the number of read/write circuits to access data in the memory cell is increased, thereby the area of the memory circuit is increased.

SUMMARY

According to an aspect of the embodiments, a memory control circuit which controls read and write of a memory having a plurality of memory cell array which are divided each other, includes a write circuit which is connected to a first memory cell array by a first bit line and a second bit line and is connected to a second memory cell array by the first bit line and a third bit line and writes data to one of the first and second memory cell array, and a read circuit which is connected to each of the first and the second memory cell array by the second bit line and the third bit line and reads the data from the memory cell array, and the first bit line connected to the write circuit is commonly connected to the first and second memory cell array.

According to another aspect of the embodiments, a memory circuit includes a plurality of memory cell array which are divided each other, a write circuit which is connected to a first memory cell array by a first bit line and a second bit line and is connected to a second memory cell array by the first bit line and a third bit line and writes data to one of the first and second memory cell array, and a read circuit which is connected to each of the first and the second memory cell array by the second bit line and the third bit line and reads the data from the memory cell array, and the first bit line connected to the write circuit is commonly connected to the first and second memory cell array.

The object and advantages of the invention will be realized and attained by means of the elements and combinations part particularly pointed out in the claims.

It is to be understood that both the foregoing general description and the following detailed description are exemplary and explanatory and are not restrictive of the invention.

DESCRIPTION OF EMBODIMENTS

Below, the embodiments will be described in the order of a first embodiment of the memory circuit, read/write operations of the memory circuit, another embodiment of the memory circuit, and the other embodiment. However, the disclosed memory circuit and the memory cell are not limited to these embodiments.

First Embodiment of the Memory Circuit

Figure 1:
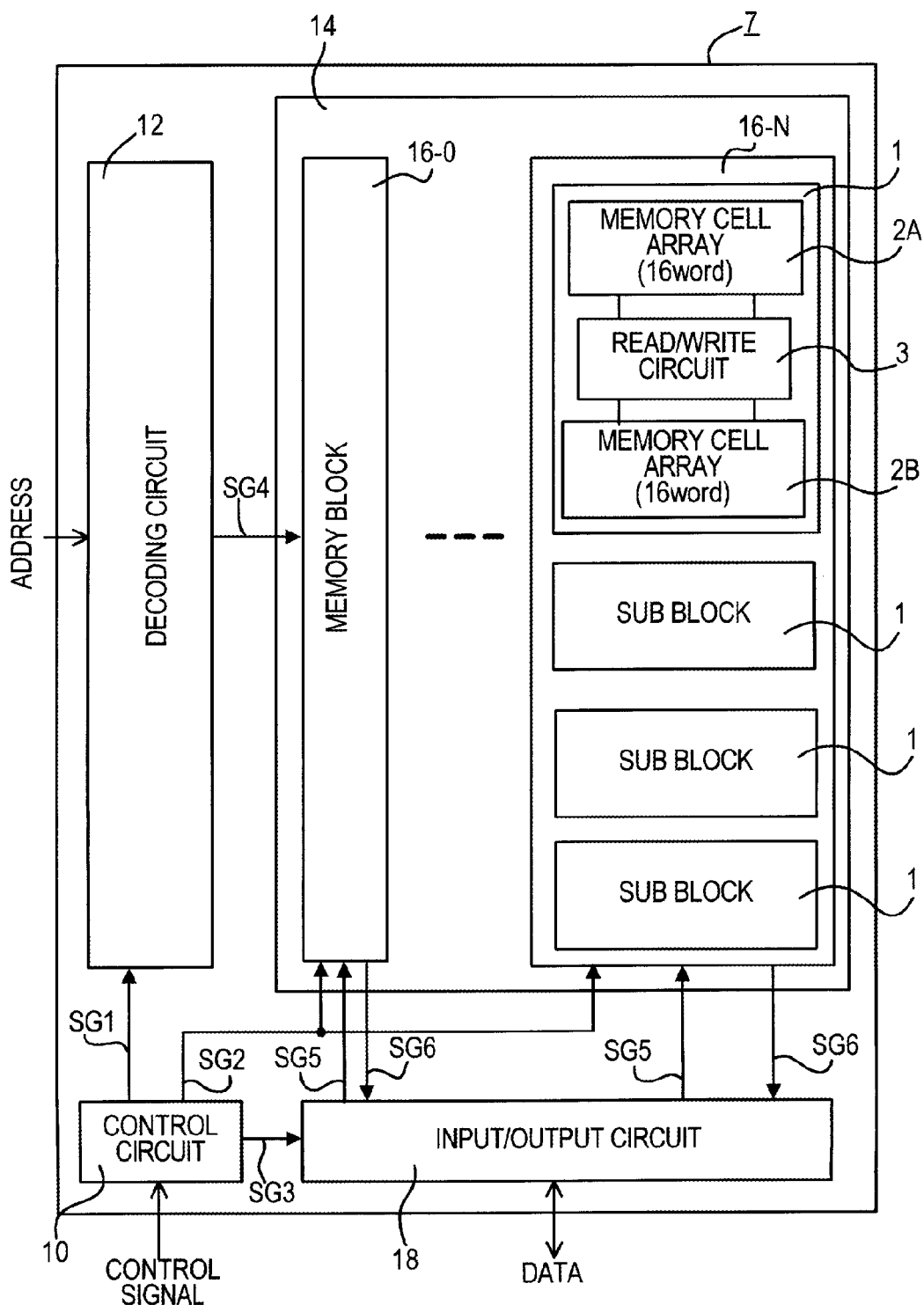
FIG. 1 is a block diagram of a memory circuit according to an embodiment.
Figure 2:
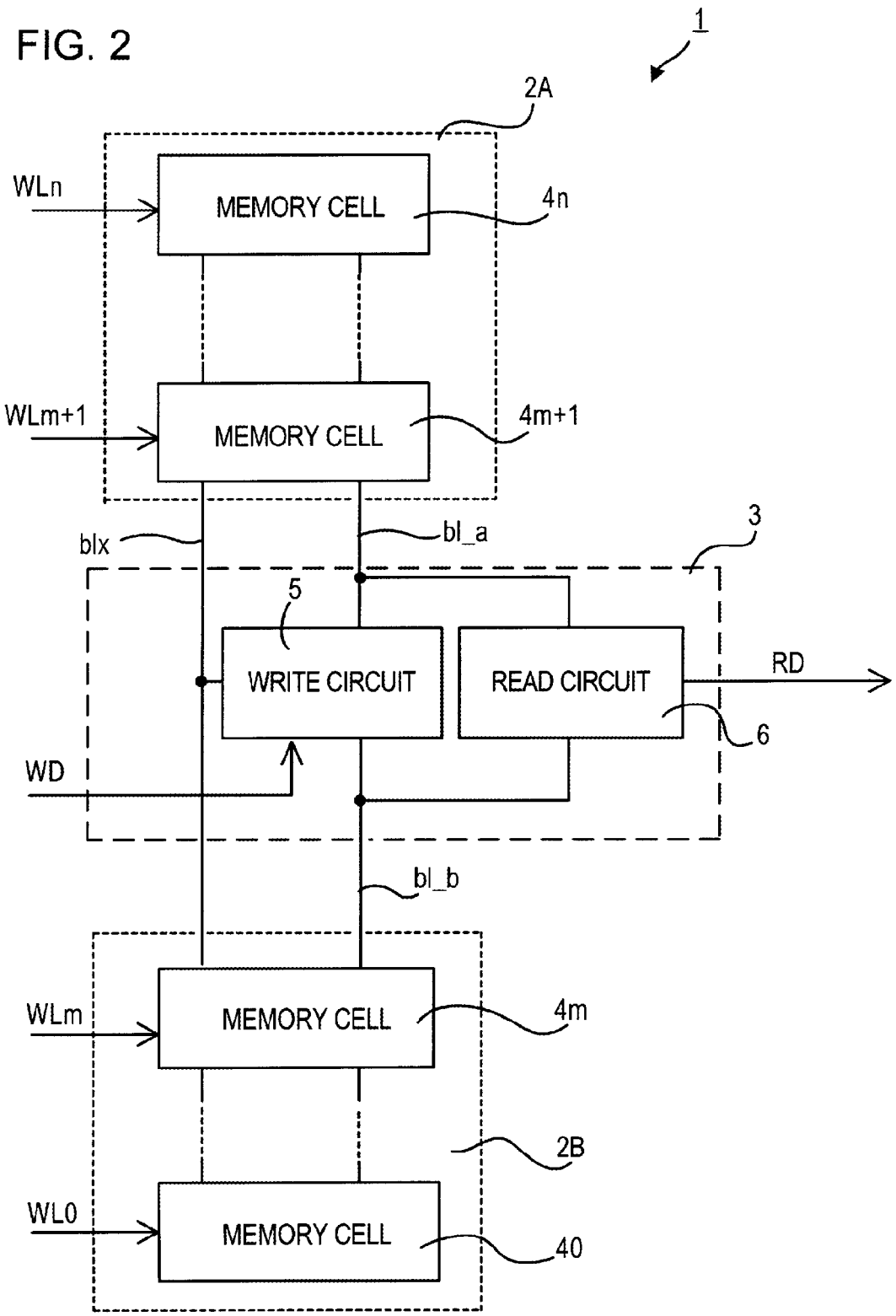
FIG. 2 is a block diagram of a sub-block in FIG. 1.

FIG. 1 is a block diagram of the memory circuit according to a first embodiment. FIG. 2 is a block diagram of a sub-block in FIG. 1. In FIG. 1 and FIG. 2, SRAM (Static Random Access Memory) 1 is illustrated as the memory circuit. As depicted by FIG. 1, the memory circuit 7 includes a control circuit 10, a decoding circuit 12, a memory circuit 14 and an input and output circuit 18.

The control circuit 10 generates control timing signals for read and write operations (a decoder control signal SG1, a read-write circuit control signal SG2, and an input and output circuit control signal SG3) and transmits them, based on a control signal from the outside of the memory circuit 7.

The decoding circuit 12 decodes an address input from the outside in response to the decoder control signal SG1 from the control circuit 10. And the decoding circuit 12 changes to enable a word select signal SG4 from the decoded result, and transmits the word select signal SG4 to the memory circuit 14.

The memory circuit 14 has a plurality of memory blocks 16-0~16-N. Each of the memory blocks 16-0~16-N has a plurality of sub-blocks 1. Each of the sub-blocks 1 includes a pair of memory cell arrays 2A and 2B and a read and write circuit 3. The read and write circuit 3 in sub block of each of the memory circuits 16-0~16-N in the memory circuit 14 performs a read operation or a write operation from and to the memory cell selected by the word select signal SG4 which is outputted from the decoding circuit 12, in response to the read and write control signal SG2.

The read and write circuit 3 transmits the input data or the output data to the input and output circuit 18. The input and output circuit 18 performs input and output of the data to the outside of the memory circuit 7, in response to the input and output control signal SG3 from the control circuit 10.

FIG. 2 is a block diagram of the sub-block 1 in the memory circuit in FIG. 1. As depicted by FIG. 2, the sub-block 1 includes two memory cell arrays 2A and 2B and a memory control circuit 3. A first memory cell array 2A includes a plurality of memory cells 4m+1~4n. The second memory cell array 2B includes a plurality of memory cells 40~4m. The word select signals WL0~WLn select one of the memory cells 40~4n.

The memory control circuit 3 is provided between the memory cell arrays 2A and 2B. In the embodiment, the memory control circuit 3 has a single write 5 and a single write circuit 6. The write circuit 5 connects to the memory cell arrays 2A and 2B by a bit line blx. The write circuit 5 receives the write data WD, and writes the write data to a memory cell in the memory cell arrays 2A and 2B.

Further, the single read circuit 6 connects to the memory cell arrays 2A and 2B through the bit lines bl_a and bl_b. The read circuit 6 reads the data in the memory cell through the bit lines bl_a and bl_b, and outputs the read data RD to the input and output circuit 18.

Figure 12:
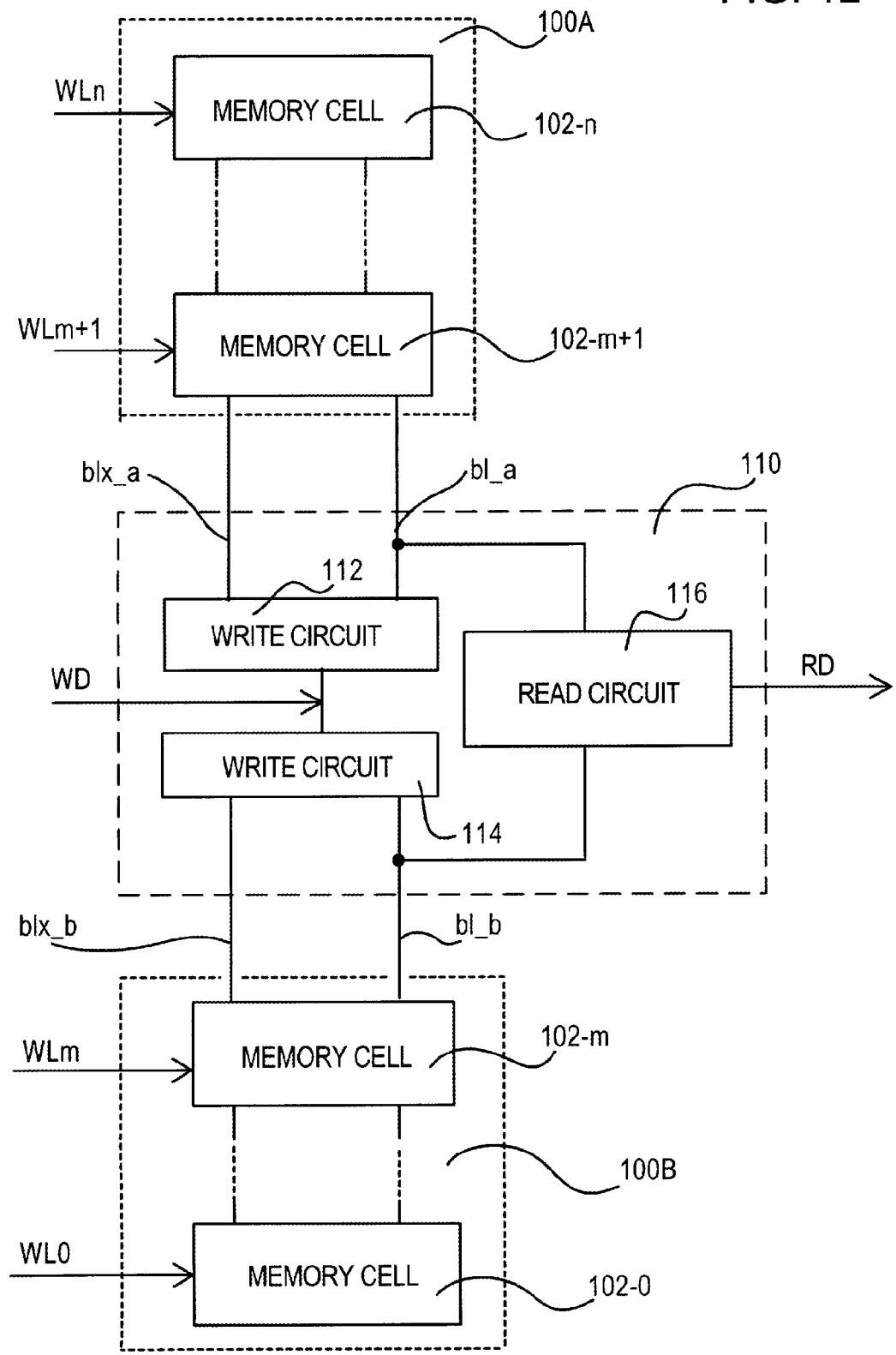
FIG. 12 is an explanatory diagram of a conventional memory circuit.

In the conventional example represented by FIG. 12, both bit lines, which are connected to both ends of the control circuit, are divided into four bit lines bl_a, bl_b, blx_a, and blx_b. In contrast, in the present embodiment, the one side line (blx) in the bit line of the memory control circuit connects to the memory cell arrays 2A and 2B.

Because the circuit configuration of the memory cells 40~4n is symmetric with respect to the connection of the bit lines, there is no problem even if either bit lines is used for read or write. In the embodiment, since the bit line blx on one side do not divide, it is possible to replace two write circuits use in the conventional example depicted by FIG. 12 with a single write circuit. Because the write data output to the bit line blx in the write circuit 5 is a single circuit system, it is possible to simplify the circuit configuration against the use of two write circuits.

Therefore, in the present embodiment, it is possible to reduce the increase of the circuit area of the memory circuit associated with division of the bit lines comparative with the conventional while increase the speed by dividing the bit line. That is, in the embodiment, it is possible to reduce the area in the read and write circuit. Therefore, it is possible the suppress to the utmost the increase in the overall size of the memory circuit.

Moreover, because the bit line blx, which is connected only to the write circuit 5, is connected, a load of the bit line for read will not change. As a result, it is possible to ensure the high-speed data read from the memory cell by dividing the bit line.

Figure 3:
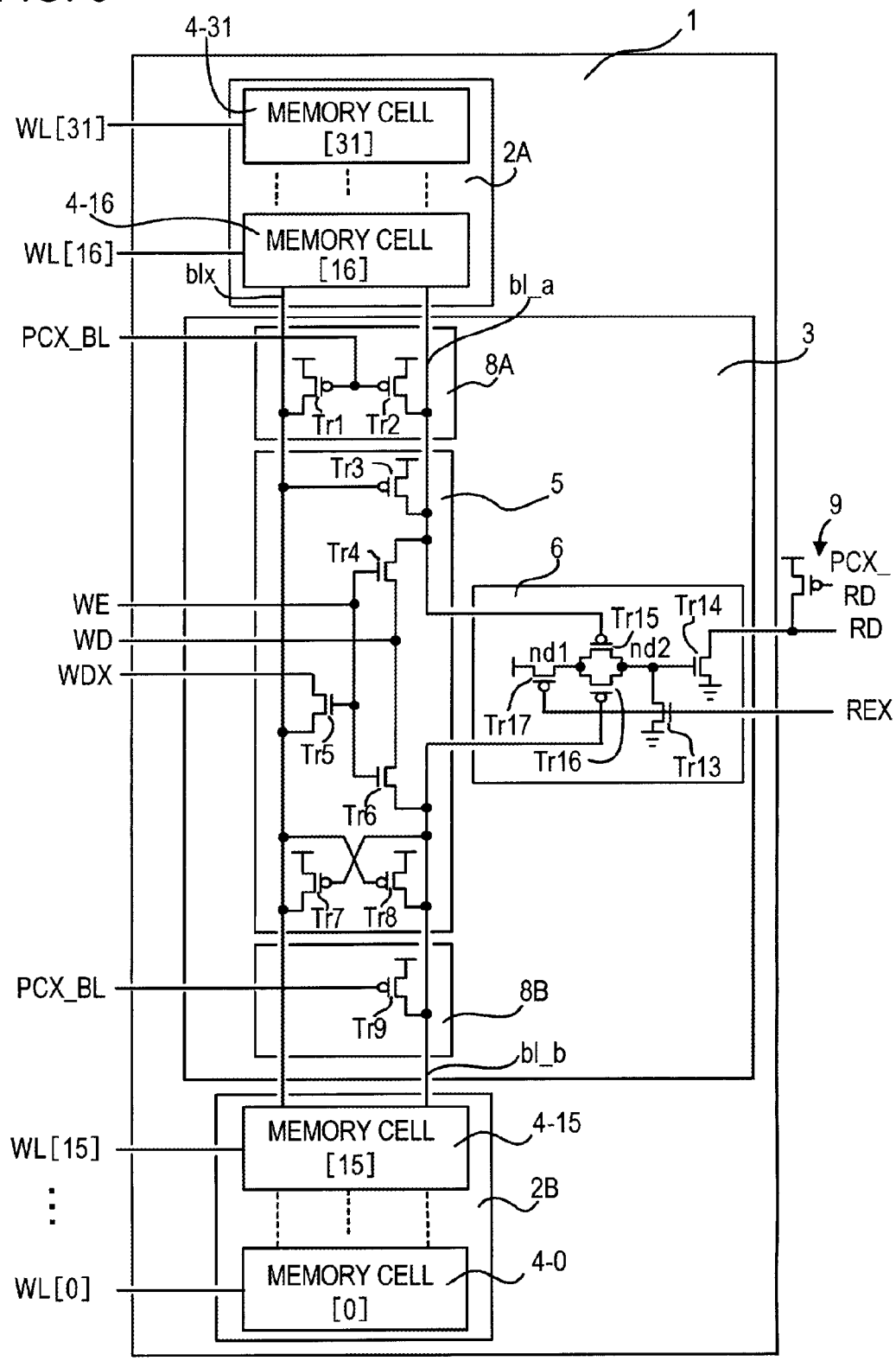
FIG. 3 is a circuit diagram of the sub-block in FIG. 1 and FIG. 2.
Figure 4:
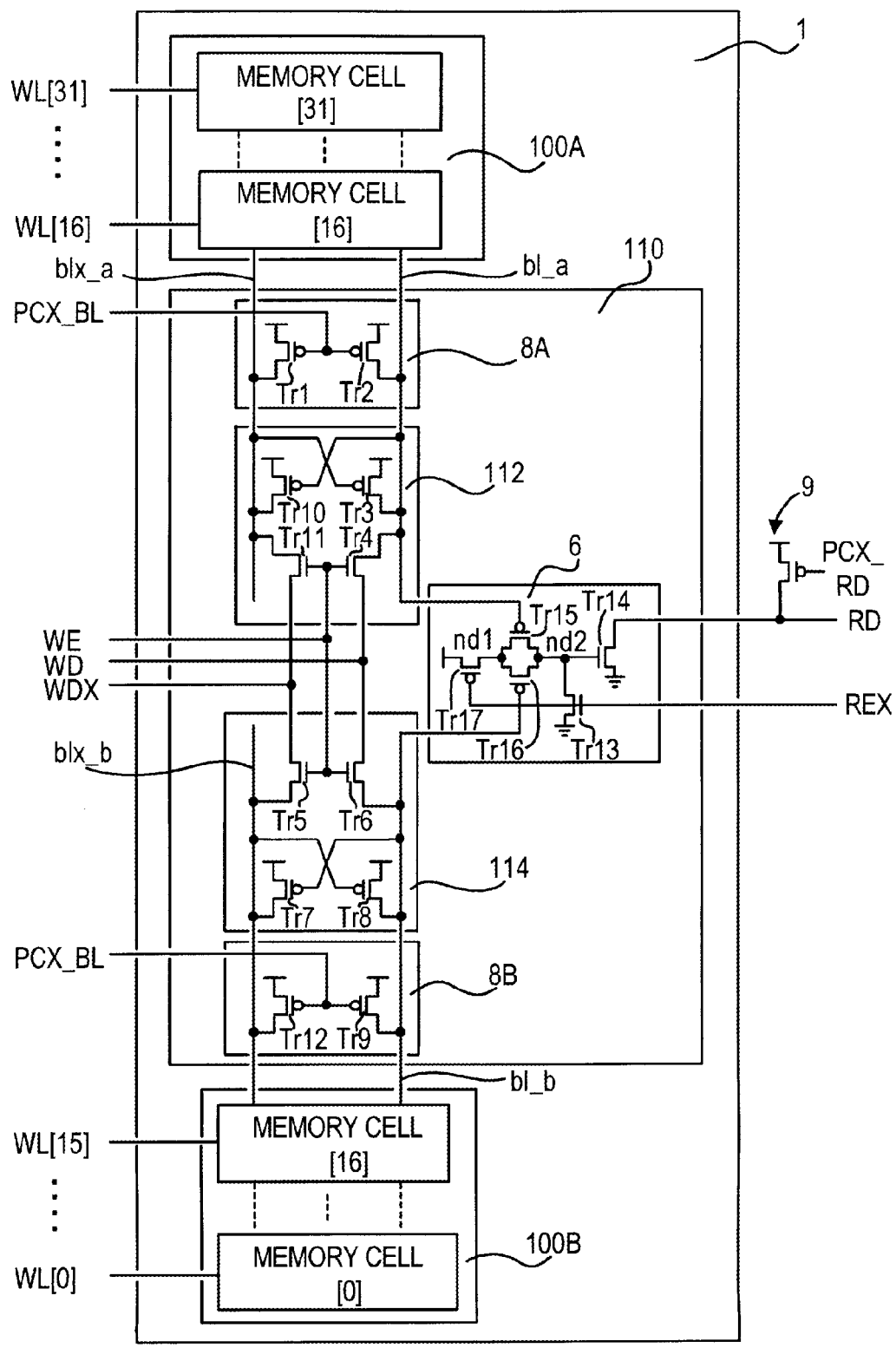
FIG. 4 is a circuit diagram of a sub-block of a comparative example in FIG. 3.

FIG. 3 is a circuit diagram of the sub-block 1 in FIG. 2. FIG. 4 is a circuit diagram of a sub-block of the comparative example. In FIG. 3 and FIG. 4, same elements as that depicted in FIG. 2 and FIG. 12 are indicated by the same symbols. In FIG. 3 and FIG. 4, a symbol WL indicates a word line. The memory cell is selected when the WL=High level. A symbol PCX_RD indicates RD (read data) initialization signal. The read data is initialized to High level when the signal PCX_RD=Low level. A symbol PCX_BL indicates a bit-line initialization signal. The bit lines blx_a, blx_b, bl_a and bl_b are initialized when the signal PCX_BL=Low level. And a symbol WE indicates a write enable signal. The write data WD is transmitted to the bit lines bl_a and bl_b and the write data WDX is transmitted to the bit lines blx_a and blx_b, when the signal WE=High level.

A symbol REX indicates a read enable signal. When the signal REX=High level, the data of the bit line bl_a or the bit line bl_b is read. A symbol WDX indicates write data (by a negative logic). A symbol WD indicates write data (by a positive logic). A symbol RD indicates read data (by a positive logic).

First, a comparative example of the sub block will be described by FIG. 4. When the bit lines are divided as indicted by FIG. 4, a first write circuit 112 (referring to FIG. 12) and a first initialization circuit 8A are provided and connected to one bit line bl_a, and a second write circuit 114 and a second initialization circuit 8B are provided and connected to another bit line bl_b. The write circuits 112 and 114 both have the same configuration.

That is, the first write circuit 112 has a first transistor Tr11 and a third transistor Tr10 which are connected to the bit line blx_a, and a second transistor Tr4 and a fourth transistor Tr3 which are connected to the bit line bl_a. The second write circuit 114 includes a fifth transistor Tr5 and a seventh transistor Tr7 which are connected to the bit line blx_b, and a sixth transistor Tr6 and a eighth transistor Tr8 which are connected to the bit line bl_b. These transistors are used for the output of the write data.

The write enable signal WE inputs to the first transistor Tr11, the second transistor Tr4 and to the fifth transistor Tr5 and the sixth transistor Tr6. Accordingly, the write data WD, WDX is written into the memory cell, which is selected by the word selection signal WL, via the initialization circuits 8A and 8B.

Further, the first initialization circuit 8A includes a ninth transistor Tr1 which is connected to the bit line blx_a, and a tenth transistor Tr2 which is connected to the bit line bl_a. The second initialization circuit 8B includes a eleventh transistor Tr11 which is connected to the bit line blx_b, and a twelfth transistor Tr9 which is connected to the bit line bl_b. The bit line initialization signal PCX_BL inputs to the initialization circuits 8A and 8B. The bit lines blx_a, blx_b, bl_a, and bl_b are initialized when the signal PCX_BL=Low level.

The read circuit 6 includes a thirteenth transistor Tr17 and a fourteenth transistor Tr13 which operate by the read enable signal REX, a fifteenth transistor Tr15 and a sixteenth transistor Tr16 which are connected to the bit lines bl_a and bl_b from the memory cell, and an output transistor Tr14. In addition, a third initialization circuit 9 has a seventeenth transistor Tr which initializes the read data from the output transistor Tr14 to a High level in response to the RD initialization signal PCX_RD.

The read circuit 6 is a circuit called to a single-ended input circuit. In other words, the read circuit 6 charges the read data line RD to a High by the RD initialization signal PCX_RD. When the read data in the bit line bl_a from the memory cell is Low, the gates of the fifteenth transistor Tr15 and the sixteenth transistor Tr16 are turned on and the gate of the transistor Tr14 is applied the High output. Therefore, the level of the read data line RD is dropped to Low (Gnd: Ground), and becomes the same value as the read result from the memory.

On the other hand, as depicted by FIG. 3, in the embodiment, one bit lines blx_a and blx_b, which are illustrated in FIG. 4, are connected in common. In FIG. 3, the bit line which are connected in common indicates "blx". And in FIG. 3, same elements as that illustrated in FIG. 4 are indicated by the same symbols.

By the bit line blx which are connected in common, the transistor for output of the write data (WD, WDX) in the write circuit 5, which are connected to the bit line blx can be configured in the transistor Tr5. That is, it is possible to replace two output transistors Tr5 and Tr11 as illustrated in FIG. 4 with single transistor Tr5. In addition, the transistors for writing support, which are connected to the bit line blx as depicted by FIG. 4, can be configured in the transistor Tr7. That is, it is possible to replace two transistors Tr7 and Tr11 for writing support with single transistor Tr7.

In addition, in the bit line side blx in which the bit line is not divided, the initialization transistors in the pair of bit line initialization circuits 8A and 8B can be configured with a single transistor Tr1. Further, other configurations in FIG. 3 are the same as FIG. 4.

In this way, by making the bit line blx which is only used for the write operation in common, it is possible to reduce the number of three transistors in the read and write circuit without compromising reading performance. In other words, the number of transistors in the read and write circuit 3 can be reduced to 17% (3/17). This reduction is proportional to the number of divisions of the sub memory arrays 2A, 2B and the data width of the memory circuit.

In addition, since the read circuit is constructed of a single-ended input circuit, it is possible to configure in compact compared to the differential amplifier. In addition, since there is no need for timing such as enable in a single-ended circuit, it is possible to omit a timing generation circuit.

(Read/Write Operation of the Memory Circuit)

Figure 5:
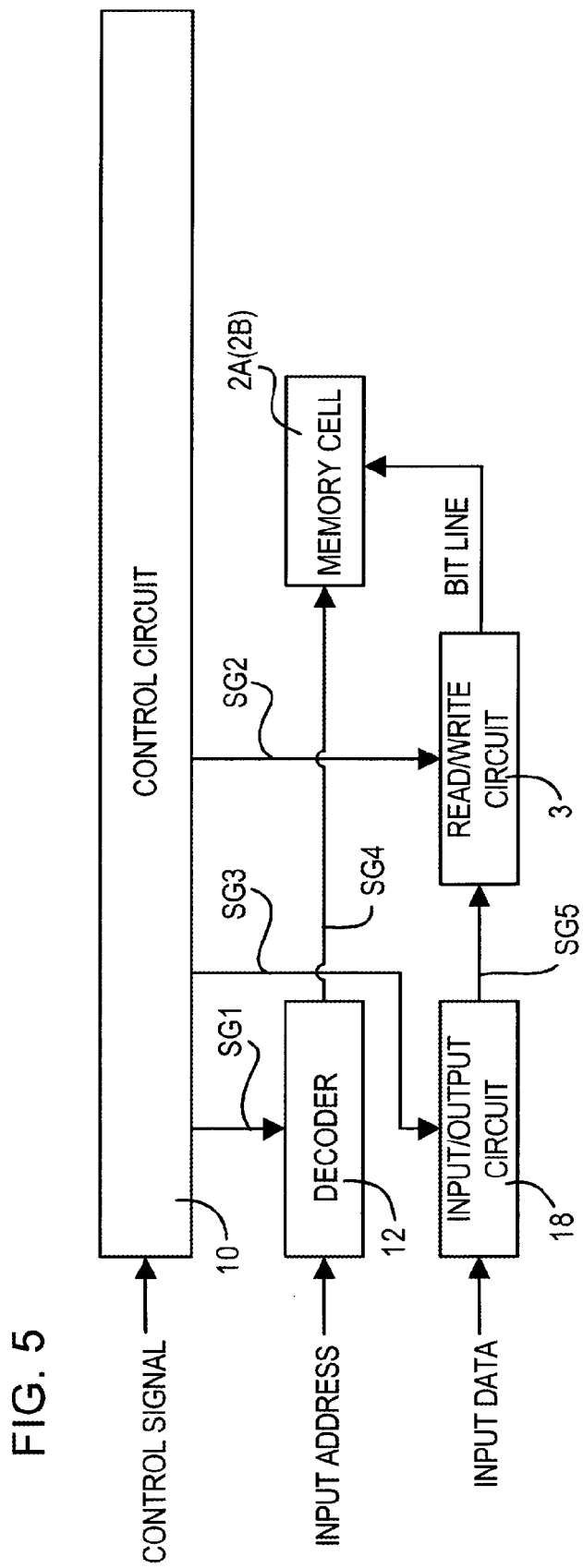
FIG. 5 is an explanatory diagram of a write operation in FIG. 1 and FIG. 2.
Figure 6:
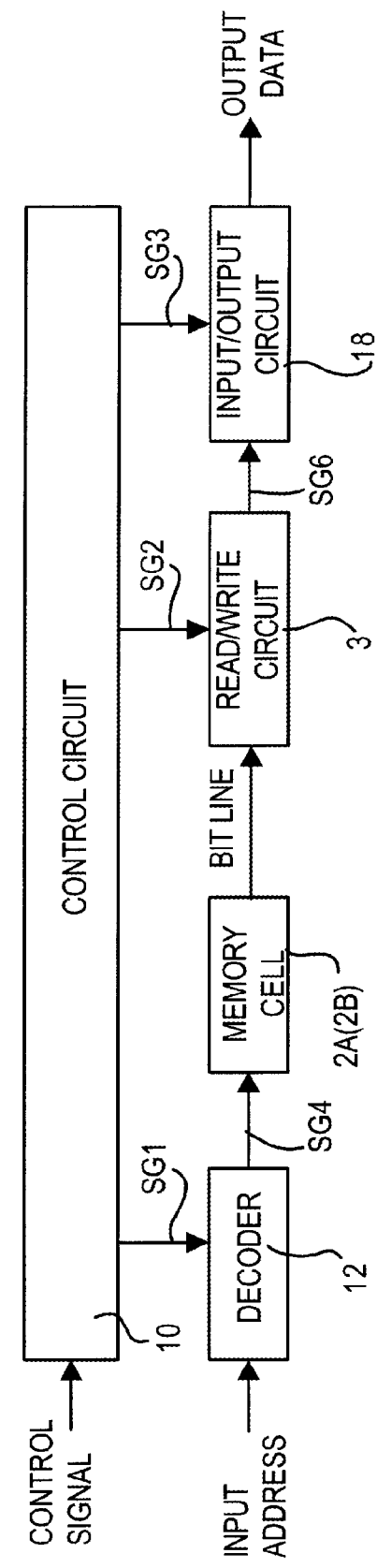
FIG. 6 is an explanatory diagram of a read operation in FIG. 1 and FIG. 2.
Figure 7:
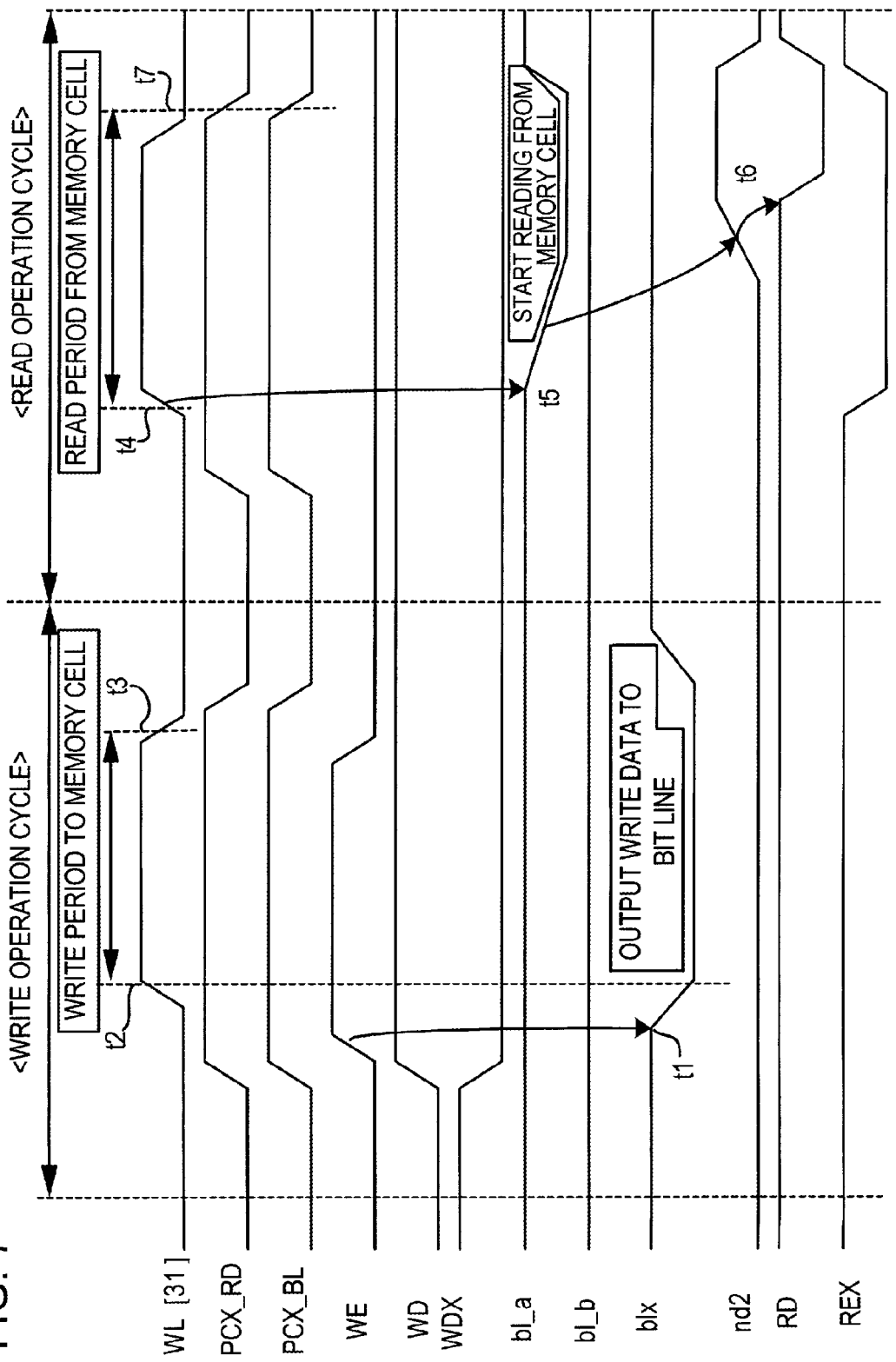
FIG. 7 is a time chart of the read and write operations in FIG. 5 and FIG. 6.
Figure 8:
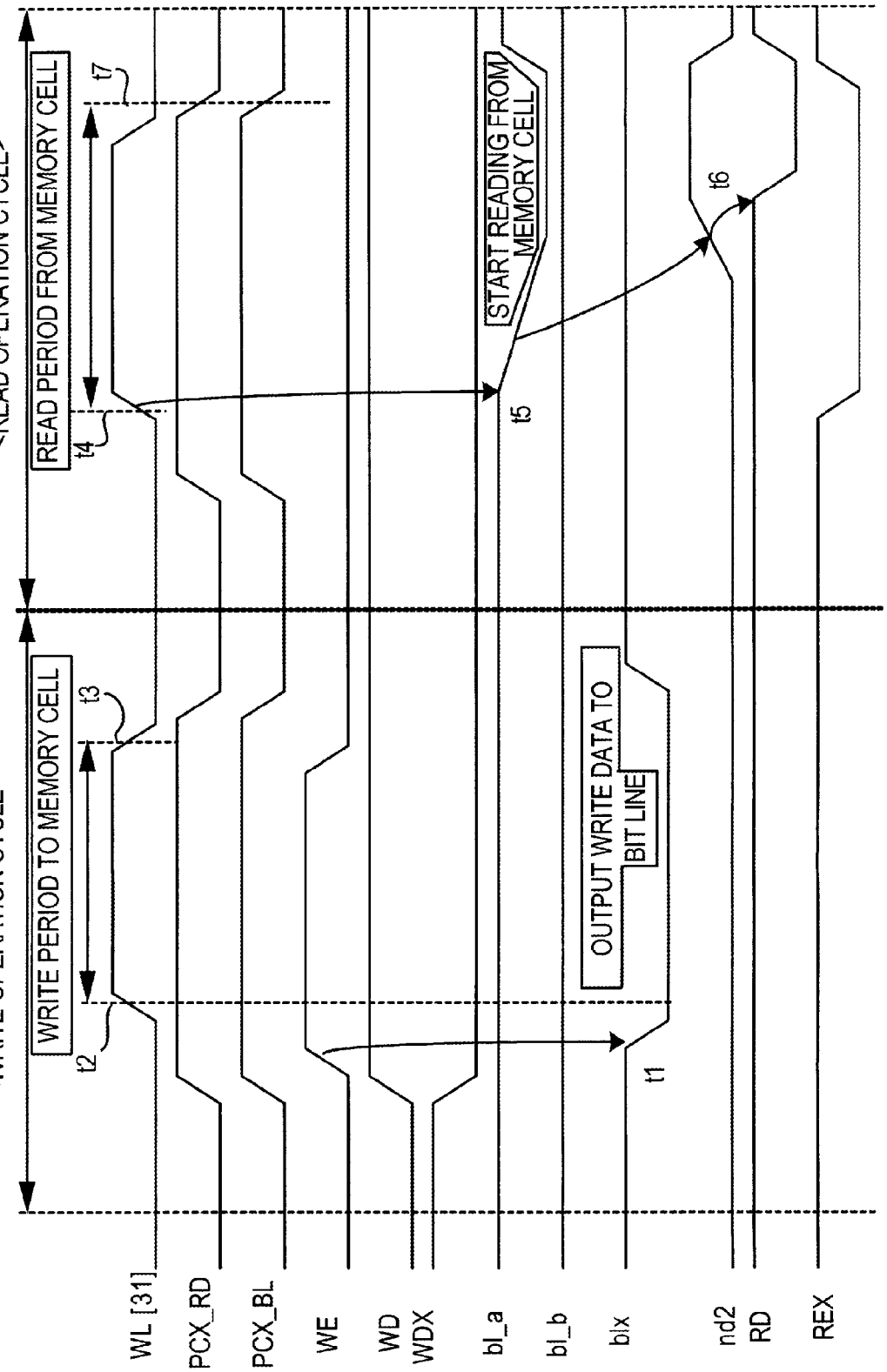
FIG. 8 is a time chart of read and write operations of the comparative example in FIG. 7.

FIG. 5 is an explanatory diagram of a write operation according to the embodiment. FIG. 6 is an explanatory diagram of a read operation according to the embodiment. FIG. 7 is a time chart of a read/write operation according to the embodiment. FIG. 8 is a time chart of the read/write operation of the comparative example. FIG. 7 and FIG. 8 illustrate the read/write operation when the word 31 is selected by the word selection signal WL [31].

The write operation in FIG. 5 will be described with reference to FIG. 7 and FIG. 8. The control circuit 10 generates control timing signals of the write operation (the decoding control signal SG1, the write circuit control signal SG2, and the input and output control signal SG3) based on the control signal (write) from the external of the memory circuit 7, and transmits the control timing signals. The decoding circuit 12 decodes the address input from the external in response to the decoding control signal SG1 from the control circuit 10. And the decoding circuit 12 changes the word select signal SG4 to enable state from decoded result and transmits the word select signal SG4 (WL) to the memory circuit 14.

The input and output circuit 18 receives the write data (the input data in FIG. 5), and transmits the write enable signal WE, the write data WD and WDX to the read and write circuit 3. The read and write circuit 3 performs a write operation to the memory cell selected by the word selection signal SG4 which is outputted from the decoding circuit 12 by the write enable signal WE, and the write data WD and WDX.

As illustrated in the write operation cycle of FIG. 7 and FIG. 8, in response that the write enable signal WE is High, the write data WD (WDX) is output to the bit line blx (as indicated by timing t1 in FIG. 7). Then, the write enable signal becomes Low and a word line which is selected the memory cell becomes to unselect state (as indicated by timing t3 in FIG. 7).

A period of the write operation to the memory cell is a period from the timing t1 at which the write data (WDX) is output to the bit line blx to the timing t3 at which the word line for selecting the memory cell is unselected.

In the embodiment, since the wiring length of the one bit line blx is longer for the conventional example, the output change (falling) of the write data to the bit line is slower than that of the conventional example of FIG. 8. However, since there is sufficient margin for the write period of the memory cell, the output change does not directly affect the writing to the memory cell.

Next, the read operation in FIG. 6 will be described with reference to FIG. 7 and FIG. 8. The control circuit 10 generates control timing signals of the write operation (the decoding control signal SG1, the write circuit control signal SG2, and the input and output control signal SG3) based on the control signal (read) from the external of the memory circuit 7, and transmits the control timing signals. The decoding circuit 12 decodes the address input from the external in response to the decoding control signal SG1 from the control circuit 10. And the decoding circuit 12 changes the word select signal SG4 to enable state from decoded result and transmits the word select signal SG4 (WL) to the memory circuit 14.

The read and write circuit 3 performs a read operation to the memory cell selected by the word selection signal SG4 which is outputted from the decoding circuit 12 by the read enable signal REX. The input and output circuit 18 receives the read data in response to the control signal SG3 and transmits the read data to the external.

As illustrated in the read operation cycle in FIG. 7 and FIG. 8, when the write enable signal WE is Low and the initialization signal PCX_RD becomes High and the word select signal WL [31] is supplied (as depicted by timing t4 in FIG. 7), the data is read from the memory cell through the bit line bl_a (as depicted by timing t5 in FIG. 7). When the read data line RD is charged to High by the RD initialization signal PCX_RD, and when the read data of the bit line bl_a from the memory cell is Low, the gate of the fifteenth transistor Tr15 is turned on, then the gate of the output transistor Tr14 is applied to the High. Thereby, the level of the read data line RD is dropped to Low (Gnd: Ground), and memory read result is output as read data RD (as depicted by timing t6 in FIG. 7).

The period of read operation to the memory cell is a period from the timing t4 at which the word selection signal is output to the timing t7 at which the initialization signal PCX_BL becomes Low. In the embodiment, since the read operation does not change with a conventional read operation, it is possible to maintain a high speed read of the memory cell.

The Other Embodiment of the Memory Circuit

Figure 9:
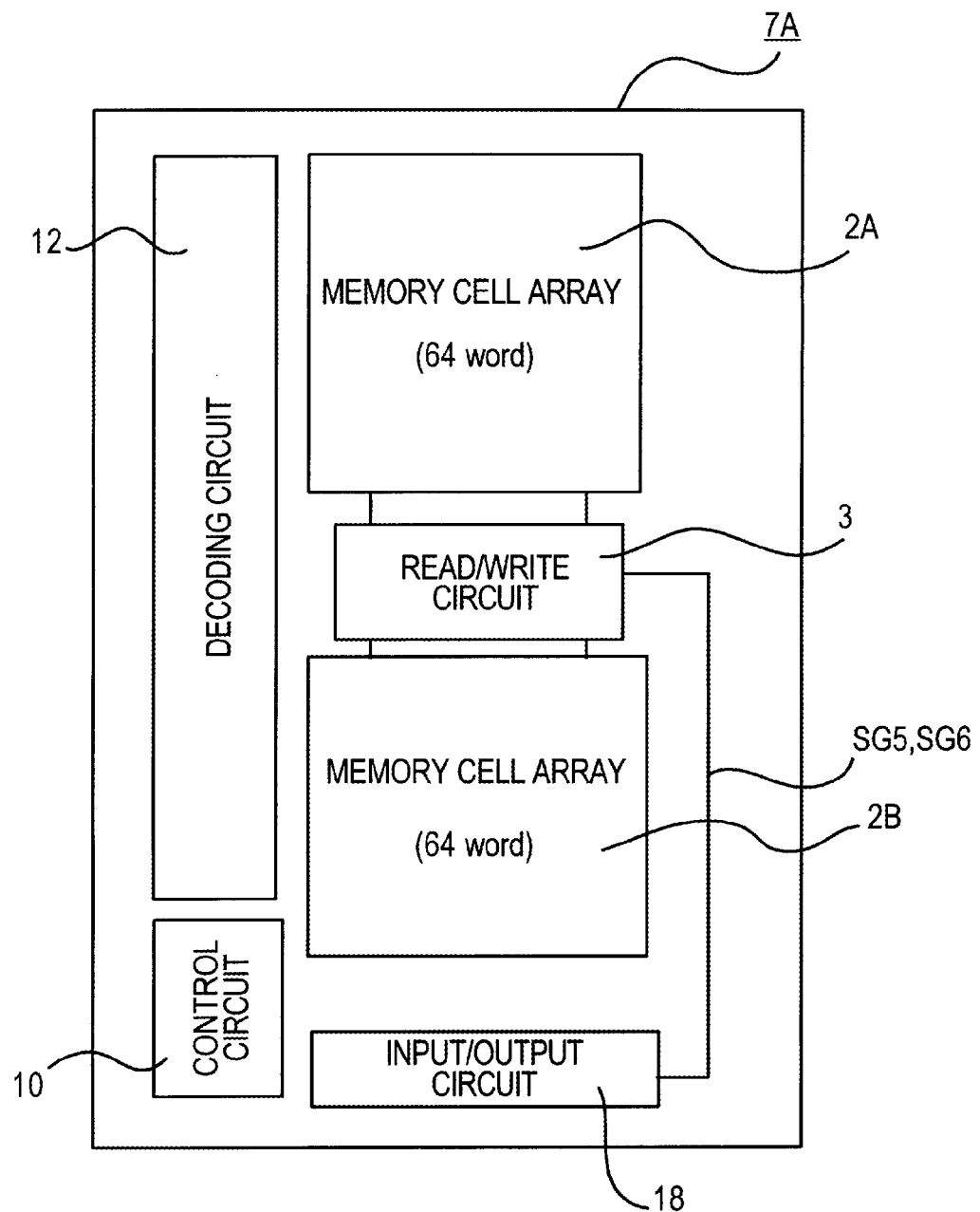
FIG. 9 is a block diagram of a sub-block according to a second embodiment.
Figure 10:
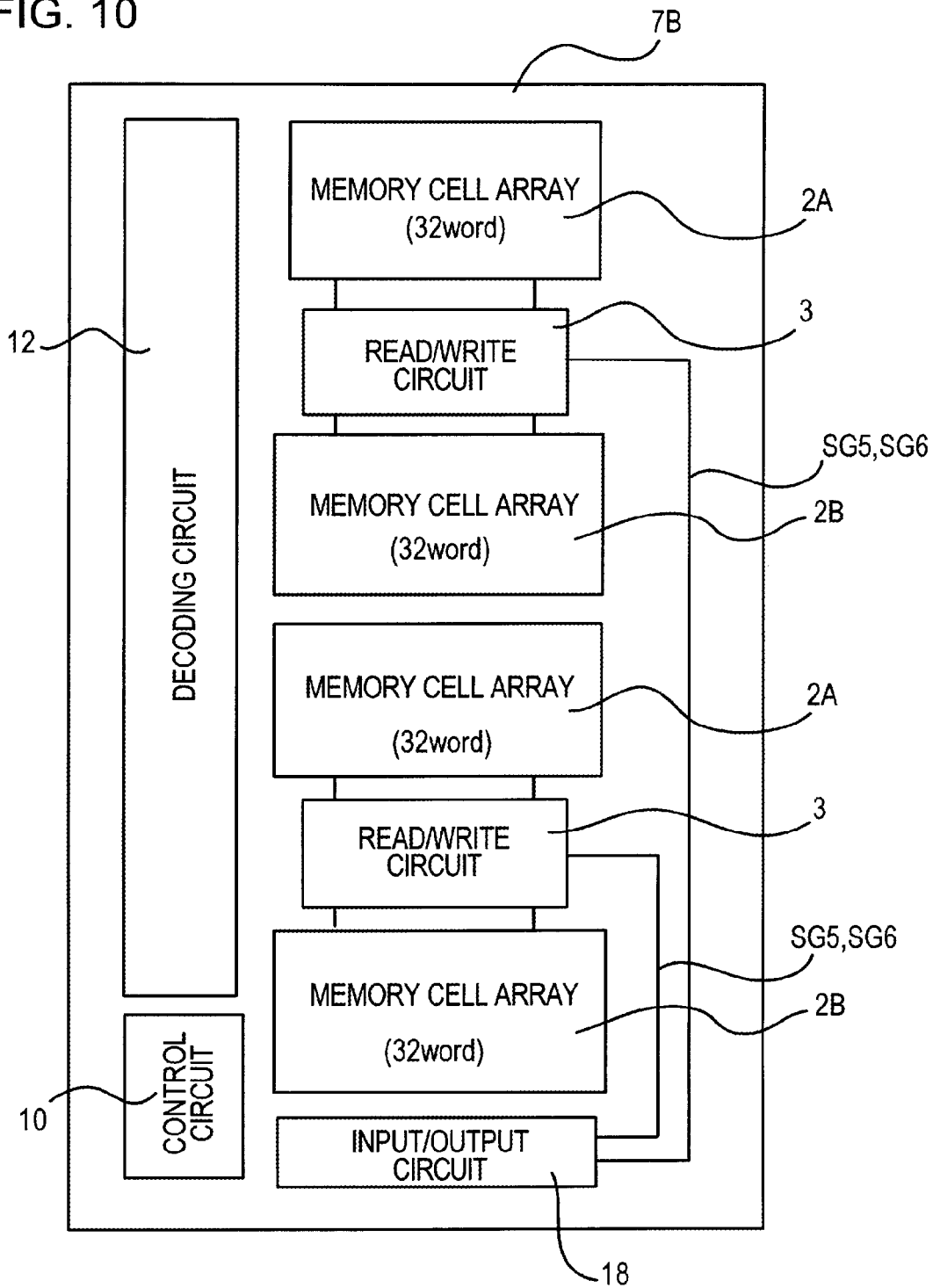
FIG. 10 is a block diagram of a sub-block according to a third embodiment.
Figure 11:
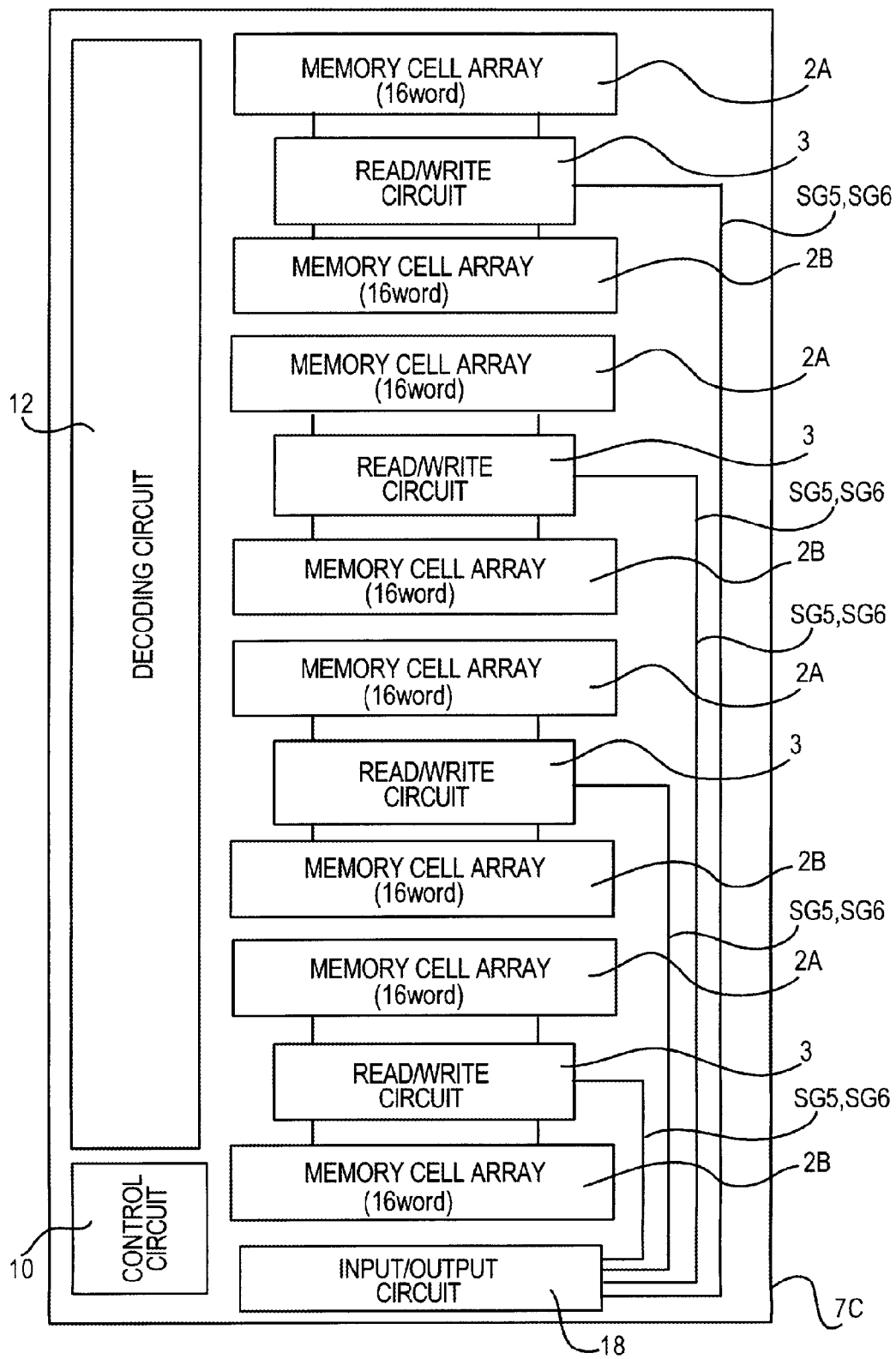
FIG. 11 is a block diagram of a sub-block according to a fourth embodiment.

FIG. 9, FIG. 10 and FIG. 11 are block diagrams of the memory circuit according to the other embodiments. In FIG. 9, FIG. 10 and FIG. 11, same elements as that described in FIG. 1 to FIG. 4, are indicated by the same symbols. FIG. 9 illustrates a memory circuit in which the memory cell arrays are divided by two. FIG. 10 illustrates a memory circuit in which the memory cell arrays are divided by four. FIG. 11 illustrates a memory circuit in which the memory cell arrays are divided by eight. As illustrated by FIG. 9, FIG. 10 and FIG. 11, as increasing the number of divisions of the memory cell array, the bit line is also much shorter, thereby the high-speed memory access can be performed. On the other hand, as increasing the number of divisions of the memory cell array, the number of the read and write circuit are increased correspondingly, thereby the area of the memory circuit is increased.

In the embodiment, since it is possible to reduce the number of transistors in the read and write circuit, it is possible to reduce the area occupied by the read and write circuit, thereby it is possible to minimize the increase in the area of the memory circuit. Further, since the area of the read and write circuit is small, it is possible to shorten the wiring length of the signal lines SG5 and SG6 from each of the read and write circuit 3 to the input and output circuit 18. Therefore, the wiring length between the sub array and the input and output circuit can be shortened and the output speed of the memory can be improved.

Other Embodiments

In the above embodiment, the memory circuit has been described in the SRAM, but DRAM (Dynamic Random Access Memory) and other nonvolatile memory circuit may also be applied. In addition, the number of divisions of the memory cell array may be a plural. Further, the read circuit has been described with a single-ended input circuit, but may be configured in other circuits, such as a differential amplifier.

The foregoing has described the embodiments of the present invention, but within the scope of the spirit of the present invention, the present invention is able to various modifications, and it is not intended to exclude them from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention has been described in detail, it should be understood that the various changes, substitutions, and alterations could be made hereto without departing from the spirit and scope of the invention.

What is claimed is:

1. A memory control circuit that controls a read and write operation of a memory having a plurality of divided memory cell arrays that each comprises a plurality of memory cells, the memory control circuit comprising:
  a write circuit that connects to each of the memory cells in a first memory cell array of the plurality of the memory cell arrays via a first bit line and a second bit line, connects to each of memory cells in a second memory cell array of the plurality of the memory cell arrays via the first bit line and a third bit line and writes data to the memory cell in one of the first and second memory cell arrays; and
  a read circuit that connects to each of the memory cells in the first memory cell array via the second bit line and connects to each of the memory cells in the second memory cell arrays via the third bit line,
  and wherein the first bit line, which connects to the write circuit, is connected to the first and second memory cell arrays in common,
  wherein the memory control circuit further comprises:
    a common initialization circuit that initializes the first bit line;
    a second initialization circuit that initializes the second bit line; and
    a third initialization circuit that initializes the third bit line.

2. The memory control circuit according to claim 1, wherein the write circuit comprises a common transistor that outputs a write control signal to the memory cell arrays via the first bit line.

3. The memory control circuit according to claim 1, wherein the read circuit comprises a single ended circuit that outputs read data from signals of the second bit line and the third bit line.

4. The memory control circuit according to claim 2, wherein the read circuit comprises a single ended circuit that outputs read data from signals of the second bit line and the third bit line.

5. A memory circuit comprising:
  a plurality of sub blocks, each comprising:
    a plurality of divided memory cell arrays that each comprises a plurality of memory cells;
    a write circuit that connects to each of the memory cells in a first memory cell array of the plurality of the memory cell arrays via a first bit line and a second bit line, connects to each of memory cells in a second memory cell array of the plurality of the memory cell arrays via the first bit line and a third bit line and writes data to the memory cell in one of the first and second memory cell arrays; and a read circuit that connects to each of the memory cells in the first memory cell array via the second bit line and connects to each of the memory cells in the second memory cell arrays via the third bit line, and wherein the first bit line, which connects to the write circuit, is connected to the first and second memory cell arrays in common inside respective sub block of the plurality of sub blocks, and the write circuit in each of the sub block of the plurality of sub blocks respectively receives the write data from an outside.

6. The memory circuit according to claim 5, wherein the write circuit comprises a common transistor that outputs the write data to the memory cell arrays via the first bit line in response to a write enable signal of the sub block.

7. The memory circuit according to claim 5, wherein the memory circuit further comprises a common initialization circuit that initializes the first bit line.

8. The memory circuit according to claim 6, wherein the memory circuit further comprises a common initialization circuit that initializes the first bit line.

9. A memory circuit comprising:
a plurality of divided memory cell arrays that each comprises a plurality of memory cells;
a write circuit that connects to each of the memory cells in a first memory cell array of the plurality of the memory cell arrays via a first bit line and a second bit line, connects to each of memory cells in a second memory cell array of the plurality of the memory cell arrays via the first bit line and a third bit line and writes data to the memory cell in one of the first and second memory cell arrays; and
a read circuit that connects to each of the memory cells in the first memory cell array via the second bit line and connects to each of the memory cells in the second memory cell arrays via the third bit line,
and wherein the first bit line, which connects to the write circuit, is connected to the first and second memory cell arrays in common,
wherein the memory circuit further comprises:
a common initialization circuit that initializes the first bit line;
a second initialization circuit that initializes the second bit line; and
a third initialization circuit that initializes the third bit line.

10. A memory circuit comprising:
a plurality of divided memory cell arrays that each comprises a plurality of memory cells;
a write circuit that connects to each of the memory cells in a first memory cell array of the plurality of the memory cell arrays via a first bit line and a second bit line, connects to each of memory cells in a second memory cell array of the plurality of the memory cell arrays via the first bit line and a third bit line and writes data to the memory cell in one of the first and second memory cell arrays; and
a read circuit that connects to each of the memory cells in the first memory cell array via the second bit line and connects to each of the memory cells in the second memory cell arrays via the third bit line,
and wherein the first bit line, which connects to the write circuit, is connected to the first and second memory cell arrays in common,
wherein the write circuit comprises a common transistor that outputs a write control signal to the memory cell arrays via the first bit line,
wherein the memory circuit further comprises:
a common initialization circuit that initializes the first bit line;
a second initialization circuit that initializes the second bit line; and
a third initialization circuit that initializes the third bit line.

11. The memory circuit according to claim 5, wherein the read circuit comprises a single ended circuit that outputs read data from signals of the second bit line and the third bit line.

12. The memory circuit according to claim 6, wherein the read circuit comprises a single ended circuit that outputs read data from signals of the second bit line and the third bit line.

13. The memory circuit according to claim 5, wherein the memory circuit further comprises:
a decoding circuit that decodes memory address and outputs a word select signal to the memory cell arrays; and
an input and output circuit that performs an input and output of the data to and from the memory cell arrays via the write circuit and the read circuit.

* * * * *